(12) United States Patent
Takamura

(10) Patent No.: US 7,365,828 B2
(45) Date of Patent: Apr. 29, 2008

(54) EXPOSURE APPARATUS, EXPOSURE METHOD, AND DEVICE MANUFACTURING METHOD

(75) Inventor: Yuichi Takamura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 216 days.

(21) Appl. No.: 11/215,021

(22) Filed: Aug. 31, 2005

(65) Prior Publication Data

US 2006/0050256 A1   Mar. 9, 2006

(30) Foreign Application Priority Data

Sep. 3, 2004   (JP)   ............... 2004-257418

(51) Int. Cl.
  *G03B 27/42* (2006.01)
  *G03B 27/52* (2006.01)
(52) U.S. Cl. .......................................... 355/53; 355/30
(58) Field of Classification Search ................. 355/30, 355/53, 77; 430/30, 311
See application file for complete search history.

(56) References Cited

U.S. PATENT DOCUMENTS

| | | | |
|---|---|---|---|
| 2005/0048220 A1* | 3/2005 | Mertens et al. | 427/553 |
| 2005/0243293 A1* | 11/2005 | Hara et al. | 355/53 |
| 2005/0259234 A1* | 11/2005 | Hirukawa et al. | 355/53 |
| 2007/0076183 A1 | 4/2007 | Hara et al. | 355/53 |

FOREIGN PATENT DOCUMENTS

| | | |
|---|---|---|
| EP | 1 659 620 A1 | 5/2006 |
| JP | 6-124873 | 5/1994 |
| JP | 10-303114 | 11/1998 |
| WO | WO 99/49504 | 9/1999 |
| WO | WO 2004/053955 A1 * | 6/2004 |
| WO | WO 2005/022615 A1 | 3/2005 |

OTHER PUBLICATIONS

English Translation of WO99/49504 (dated Sep. 30, 1999) cited by Applicant.*

* cited by examiner

*Primary Examiner*—Alan A Mathews
(74) *Attorney, Agent, or Firm*—Fitzpatrick, Cella, Harper & Scinto

(57) ABSTRACT

An exposure apparatus which exposes a pattern of an original onto a substrate through a projection optical system with a space between the projection optical system and the substrate filled with liquid. The apparatus includes a liquid supply nozzle configured to supply the liquid to the space through a liquid supply opening, a liquid supply unit configured to supply the liquid into the liquid supply nozzle, a liquid recovery unit configured to recover the liquid in the liquid supply nozzle by using a vacuum source, and a gas supply unit configured to supply a gas into the liquid supply nozzle through a pipe connected to the liquid supply opening of the liquid supply nozzle. A gas supply by the gas supply unit is started and a liquid recovery by the liquid recovery unit is started while a liquid supply by the liquid supply unit is stopped.

12 Claims, 13 Drawing Sheets

F I G. 1
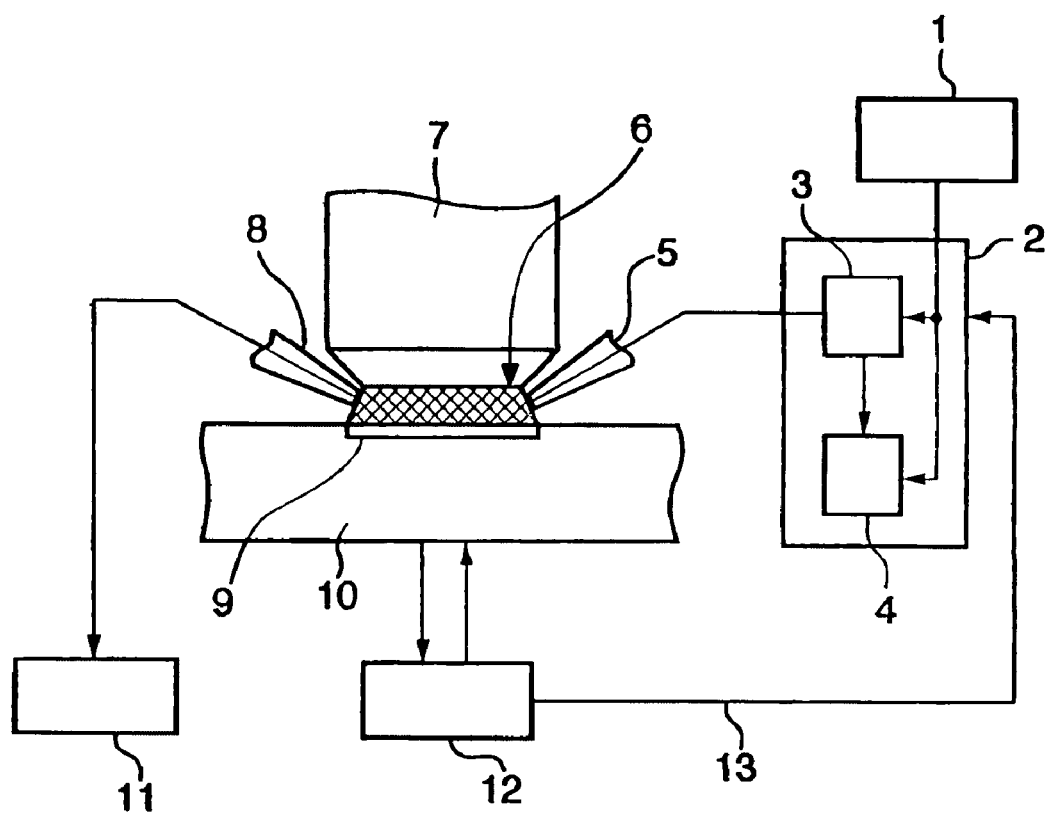

MANUFACTURING FLOW FOR SEMICONDUCTOR DEVICE

EXPOSURE APPARATUS, EXPOSURE METHOD, AND DEVICE MANUFACTURING METHOD

FIELD OF THE INVENTION

The present invention relates to a liquid immersion exposure technique for projecting a pattern of an original onto a substrate with a space between an optical system for projecting the pattern onto the substrate and the substrate being filled with liquid.

BACKGROUND OF THE INVENTION

In conventional exposure apparatuses, the space between a projection optical system and a semiconductor wafer is typically filled up with high-cleanliness air or high-purity inert gas, such as nitrogen or helium. On the other hand, liquid immersion exposure apparatuses are known, which use a method for filling the space with liquid (liquid immersion medium) (see, for example, Japanese Patent Laid-Open No. 6-124873, International Publication No. 99/049504, and Japanese Patent Laid-Open No. 10-303114), However, technology has yet to be found that pays attention to addressing a case wherein a sequence of the liquid immersion exposure is interrupted.

In the case of a local-filling-method liquid immersion exposure apparatus in which a liquid immersion medium is locally supplied immediately beneath a projection optical system, the liquid-supply position for the liquid immersion medium and the position of an exposure-target chip (or exposure-target area) should accurately coincide with each other. If a sequence stop occurs during the stage being driven, it may be possible that liquid supply is implemented somewhere off the wafer. In such a case as this, the liquid immersion medium cannot be recovered with a recovery nozzle, whereby water leakage occurs. In order to restore the apparatus to its original condition, wiping and drying works for the leaked liquid immersion medium or replacement of electrical components is required. Such a restoration operation would reduce the availability of the exposure apparatus, and even the productivity of the device. Moreover, if a liquid immersion medium accumulates in a liquid-supply pipeline or a supply nozzle, contamination or dripping on the stage, of the liquid immersion medium, becomes a concern. When the trouble has been solved and the exposure is restarted, if liquid supply is started as it is, air and the liquid immersion medium that have accumulated in the pipeline intermingle with each other, thereby generating foam that may adversely affect the exposure.

SUMMARY OF THE INVENTION

The present invention is made in view of the above-mentioned circumstances and has as an exemplified object to provide an improved liquid immersion exposure technique.

In order to solve the foregoing issues and to achieve an object, an exposure apparatus according to the present invention is an exposure apparatus having an optical system for projecting a pattern of an original onto a substrate and, with a space between the optical system and the substrate being filled up with liquid, projecting the pattern onto the substrate, the apparatus comprising:

a supply unit having a nozzle, for supplying through the nozzle liquid into the space; and a restraining unit for restraining leakage of liquid from the nozzle.

Moreover, an exposure method according to the present invention is an exposure method in which, with a space between an optical system for projecting a pattern of an original onto a substrate and the substrate being filled up with liquid, the pattern is projected onto the substrate, the method comprising steps of:

supplying through a nozzle liquid into the space; and restraining leakage of liquid from the nozzle.

Still further, the present invention can also be applied to a device manufacturing method in which a semiconductor device is produced by utilizing the foregoing exposure apparatus.

Specifically, in stopping a liquid immersion medium supply mechanism when an exposure sequence stops, by closing a liquid supply valve and opening a liquid recovery valve and an air-bleeding valve, a liquid immersion medium in the pipeline is also recovered.

In restarting supply of a liquid-immersion-medium, by controlling the initial liquid-supply flow rate so as to gradually bleed the pipeline of air, liquid supply with foam being suppressed is enabled. Therefore, a restoration time for the apparatus can be reduced.

Furthermore, by transporting dry gas into predetermined places, thereby drying a liquid immersion medium attached to the inside of a supply path, contamination of a liquid immersion medium and corrosion of the apparatus can be suppressed.

According to the present invention, an improved liquid immersion exposure technique can be provided.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such an example, however, is not exhaustive of the various embodiments of the invention, and therefore, reference is made to the claims which follow the description for determining the scope of the invention.

BRIEF DESCRIPTION OF THE DRAWINGS

FIG. 1 is a schematic diagram of a liquid immersion exposure apparatus according to an embodiment of the present invention;

DETAILED DESCRIPTION OF THE PREFERRED EMBODIMENTS

Figure 2:
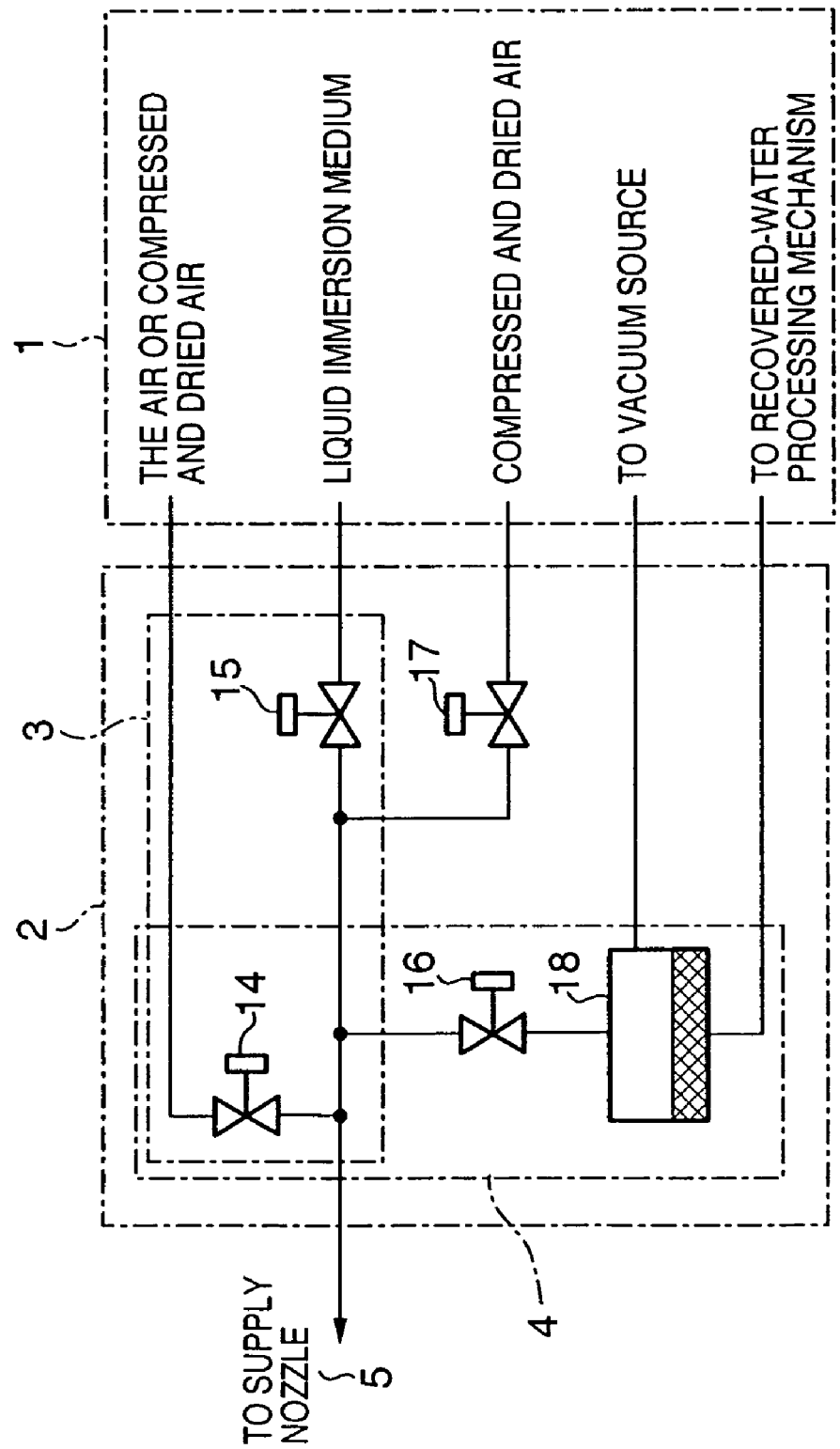
FIG. 2 is a flow diagram of a pipeline in a liquid immersion medium supply mechanism illustrated in FIG. 1.

Hereinafter, embodiments of the present invention will be explained in detail, with reference to the accompanying drawings.

Embodiments to be explained below are examples of methods of realizing the present invention, and should appropriately be modified or changed in accordance with the configuration of an apparatus to which the present invention is applied, and with various conditions.

In addition, the present invention can be achieved by providing a program code of software to the hardware system. The program code corresponds to the process steps in a method of the embodiments described below. A computer (CPU or MPU, or the like) in the hardware system operates according to the program code and, consequently, the hardware system executes the method.

[A General Explanation for a Liquid Immersion Exposure Apparatus]

In the first place, a liquid immersion exposure apparatus according to an embodiment of the present invention will be explained with reference to FIG. 1.

FIG. 1 is a schematic diagram of a liquid immersion exposure apparatus according to an embodiment of the present invention.

As illustrated in FIG. 1, by filling up with a liquid immersion medium 6, the space between a projection optical system 7 and a semiconductor wafer 9, it is possible to make the light-refraction index of that space larger than that of the air, i.e., 1.0. Letting n denote the refraction index of the liquid immersion medium, the numerical aperture (NA) of the lens (projection optical system) increases n-fold, according to Snell's law. In general, the resolution of an exposure apparatus is expressed by $k \times (\lambda/NA)$, where k, $\lambda$, and NA denote a factor related to an apparatus and a process, a wavelength of exposure light, and a numerical aperture, respectively. As described above, using a liquid immersion medium having a refraction index n makes the NA increase n-fold. Therefore, the resolution of an apparatus is theoretically raised to n-fold. As a liquid immersion medium, a number of candidates, such as ultrapure water, are possible.

The liquid immersion medium 6 is supplied from a supply source 1 to a supply nozzle 5, by way of a liquid immersion medium supply mechanism 2. After the liquid immersion medium 6 is filling up the space between the projection optical system 7 and the semiconductor wafer 9, the liquid immersion medium 6 is sucked up by a recovery nozzle 8 and then is transported to a recovery mechanism 11. The recovery mechanism 11 performs processing for recycling or discharge of the liquid immersion medium 6, for example.

The semiconductor wafer 9 is accurately positioned on a wafer stage 10. The wafer stage 10 is controlled by a stage control mechanism 12. The wafer stage 10 is a mechanism for accurately positioning between an exposure-target chip (exposure-target area) laid out on the semiconductor wafer 9 and exposure light irradiated through the projection optical system 7. The stage control mechanism 12 can output a stage drive stop signal 13 that may be inputted to the liquid immersion medium supply mechanism 2, as illustrated in FIG. 1. The liquid immersion medium supply mechanism 2 implements liquid supply control and liquid recovery control for the liquid immersion medium 6, based on the stage drive stop signal 13.

Although being described in detail, in each of the embodiments below, the liquid immersion medium supply mechanism 2 is made up of a liquid supply controller 3 and a liquid recovery controller 4, as well as a mechanism for removing water from the pipeline. The liquid supply controller 3 is a mechanism for controlling a liquid supply valve 15 in order to transport the liquid immersion medium 6 into the supply nozzle 5. As described above, it is an object of the liquid immersion medium 6 to enhance the resolution of an exposure apparatus, by making the light-refraction index to be larger than 1.0 in the air. Therefore, the liquid immersion medium 6 is required to be filled up between the projection optical system 7 and the exposure-target chip on the semiconductor wafer 9.

If the wafer stage 10 for positioning the semiconductor wafer 9 operates normally, no problem occurs. However, if, for some reason, a stage drive sequence stops during the wafer being exposed, the chip being exposed cannot be exposed, and the liquid immersion medium 6 may be supplied somewhere off of the predetermined area on the stage. The liquid immersion exposure apparatus is designed in such a way that, if the liquid supply is implemented within the predetermined area, the supply and recovery of the liquid immersion medium 6 is assured. However, if the liquid supply is implemented off of the exposure area, recovery of the liquid immersion medium may not be assured, and the operation of the exposure apparatus may have to be interrupted.

Therefore, when the liquid immersion medium 6 is supplied, the stage drive stop signal 13 should always be monitored. In other words, it is necessary to implement the liquid supply only when the wafer stage 10 is being driven normally, and to stop the liquid supply when the operation of the wafer stage 10 is out of order or at a standstill. Control such as this is carried out by the liquid supply controller 3.

Meanwhile, even though the liquid supply of liquid immersion medium 6 is instantaneously stopped based on the foregoing signal, the liquid immersion medium 6 remains inside the pipeline and the supply nozzle 5. Thus, the liquid immersion medium 6 drips onto the semiconductor wafer 9, whereby work, such as wiping may be caused. In order to prevent matters such as this, when the stage drive stop signal 13 is detected, the liquid recovery controller 4 incorporated in the liquid immersion medium recovery mechanism 2 operates. This recovers the liquid-immersion-medium inside the supply nozzle 5 and the liquid supply pipeline.

First Embodiment

FIG. 2 is a flow diagram of the pipeline in the liquid immersion medium supply mechanism illustrated in FIG. 1; numerical numbers for portions, in FIG. 2, surrounded by dashed lines coincide with those in FIG. 1. In addition, illustrations of pipelines related to compressed and dried air are omitted, because they are connected with the entire pipeline system.

As illustrated in FIGS. 1 and 2, the liquid immersion medium 6 is pressurized by an unillustrated feed-water pump and is transported by way of the liquid supply valve 15 to the supply nozzle 5. During exposure processing, the liquid supply valve 15 is always "open". However, when, as described above, a stage drive sequence stops, the stage drive stop signal 13 is generated, whereupon the supply valve 15 instantaneously becomes "closed". Accordingly, the supply of the liquid immersion medium 6 is stopped. If nothing is done, the liquid immersion medium 6 remains in the supply nozzle 5 and the pipeline between the liquid supply valve 15 and the supply nozzle 5. Thereby, the liquid immersion medium 6 drips from the front edge of the supply nozzle 5. If liquid leakage occurs, possibly, drying processing or wiping work is required prior to a restart of the exposure processing, whereby a downtime of the apparatus occurs. To address this, the liquid immersion medium supply mechanism is configured in such a way that, immediately after the foregoing stage drive stop signal 13 is generated, a liquid recovery valve 16 and an air-bleeding valve 14, which are conventionally always "closed" are made "open". Thereby, the liquid is recovered in a liquid recovery tank 18 that is made into a negative-pressure by an unillustrated vacuum source. In this situation, if the stage 10 rapidly decelerates, the liquid immersion medium 6 may fly in all directions. Therefore, it is desirable to start a liquid recovering operation for the liquid immersion medium 6 before the stage acceleration reaches that at which the liquid starts to fly in all directions. Additionally, by, concurrently with or a little later than the liquid recovering processing, a liquid supply stopper situated at the front edge of the supply nozzle 5, e.g., a shutter for cutting off the supply path, is activated. Thereby, the dripping of the liquid immersion medium 6 from the nozzle can be prevented. The liquid immersion medium 6 accumulated in the liquid recovery tank 18 is discharged to an unillustrated recovered-water processing mechanism, where the liquid immersion medium 6 is disposed of or reprocessed. In the First Embodiment, the control of supply stoppage and recovery start of the liquid immersion medium 6 is implemented based on the stage drive stop signal 13 (irregular stop of the stage, or the like). However, regardless of the stage drive stop signal 13, that control may be implemented based on a predetermined condition of the exposure apparatus (exposure operation), for example, a condition in which no exposure-job queue remains, or a condition in which a predetermined operation has been done by the operator.

In addition, the configuration and operation, of the supply nozzle 5, as well as the methods of recovering liquid and removing air in the pipeline, will be described later in Embodiments 4 through 6. Thus, explanations for them will be omitted here.

An air-blow valve 17 is a valve, for discharging at once dried and compressed air, that blows up the liquid immersion medium 6 attached to the inside of the supply nozzle 5, while drying the inside of the supply nozzle 5. Processing such as this is implemented so that the contamination of the liquid immersion medium 6 is prevented and the cleanliness factor inside the pipeline is kept. It is desirable to implement the air blowing after the wafer stage 10 is moved to a predetermined position so that blown up droplets do not affect the exposure area. It is anticipated that the timing at which the air blowing is implemented is immediately after the job has been completed or during maintenance or prior to long-term storage of the apparatus.

Second Embodiment

Figure 3:
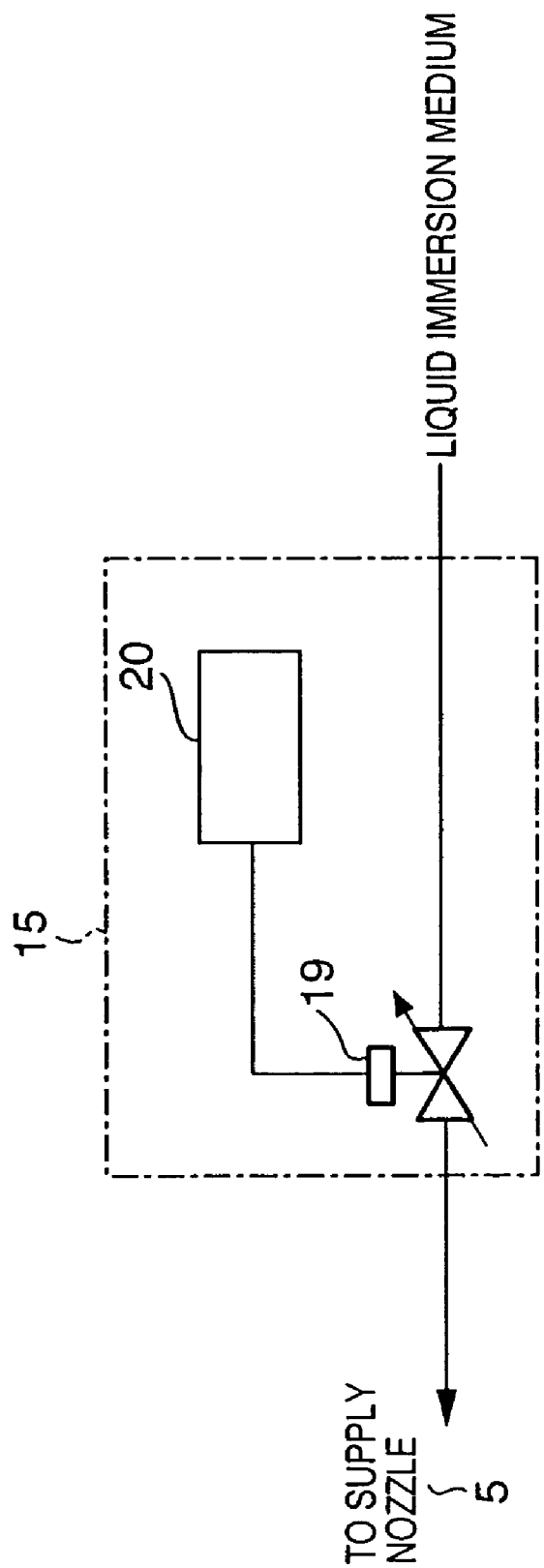
FIG. 3 is a view illustrating a liquid supply valve in a liquid immersion medium supply mechanism according to a Second Embodiment of the present invention.
Figure 4:
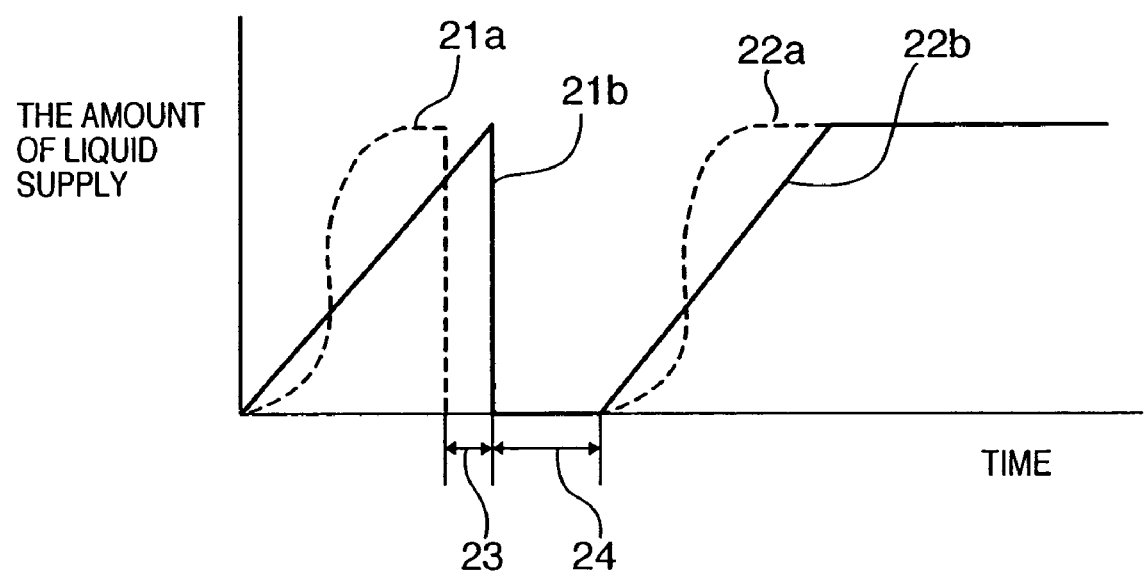
FIG. 4 is a diagram representing liquid-supply properties based on a liquid supply control according to the Second Embodiment.

FIG. 3 is a view illustrating a liquid supply valve of a liquid immersion medium supply mechanism according to a Second Embodiment of the present invention; and FIG. 4 is a diagram representing liquid-supply properties based on liquid supply control according to the Second Embodiment.

It is possible to implement more preferable liquid supply control of the liquid supply valve 15 illustrated in FIG. 3, by utilizing a variable flow rate valve 19 and a controller 20, such as an inverter.

As explained with reference to FIGS. 1 and 2, if a stage drive sequence is stopped and the stage drive stop signal is generated, the liquid supply valve 15 is fully closed, thereby immediately stopping the liquid supply. The liquid recovery valve 16 and the air-bleeding valve 14 are fully opened in order to prevent liquid dripping, thereby implementing the liquid recovering processing. Additionally, by, concurrently with or a little later than the liquid recovering processing, also activating a supply stopper situated at the front edge of the supply nozzle 5, the supply path at the front edge is cut off. In this case, the inside of the pipeline between the liquid supply valve 15 and the supply nozzle 5 is filled up with air. Then, in order to restart the exposure processing, the liquid immersion medium 6 is supplied, a great deal of foam occurs because the air inside the pipeline and the liquid immersion medium 6 rapidly intermingle with each other. When it occurs, the foam hinders light transmission, thereby affecting the exposure. Alternatively, it takes time to wait until the foam disappears, whereby the throughput is affected. In order to improve these disadvantages, immediately after the stage drive sequence can be restarted, air in the pipeline may be discharged and the pipeline may be filled up with the liquid immersion medium 6. In this situation, the liquid immersion medium 6 should gradually be transported by controlling the liquid-supply properties. Therefore, it is effective to make up the liquid immersion medium supply mechanism, for example, of the variable flow rate valve 19 and the controller 20, instead of a simple electromagnetic valve only with ON/OFF switching.

Reference numerals 21a and 21b in FIG. 4 represent the states in which, in order to slowly bleed the pipeline of air, liquid supply is gradually implemented. Reference numerals 22a and 22b represent the states in which, after a waiting time from the bleeding of air to the exposure has elapsed, the liquid supply control moves to a normal mode. In this example, in the case of reference numeral 22a, the waiting time is twenty-three plus twenty-four; in the case of reference numeral 22b, twenty-four only. Of course, these waiting times may be zero seconds. Moreover, depending on the control by the controller 20, complicated control, instead of linear control, is enabled. Reference numerals 21a and 22a in FIG. 4 intentionally represent states as described above. At the beginning of supply, in particular, the curved-shape way of liquid supply control as represented by reference numeral 21a can suppress more the occurrence of foam, and can further reduce the supply time more than in the linear way of liquid supply control as represented by reference numeral 21b. Reference numeral 23 represents the difference in supply time, caused by the difference of the control technique. Furthermore, as far as liquid supply control at the restart of exposure is concerned, if liquid supply is implemented with the valve being fully opened, rapid pressure change is generated, thereby, possibly causing metal fatigue to the pipeline or pressure overshooting. Therefore, the control technique as represented by reference numerals 22a and 22b is more preferable.

Third Embodiment

Figure 5:
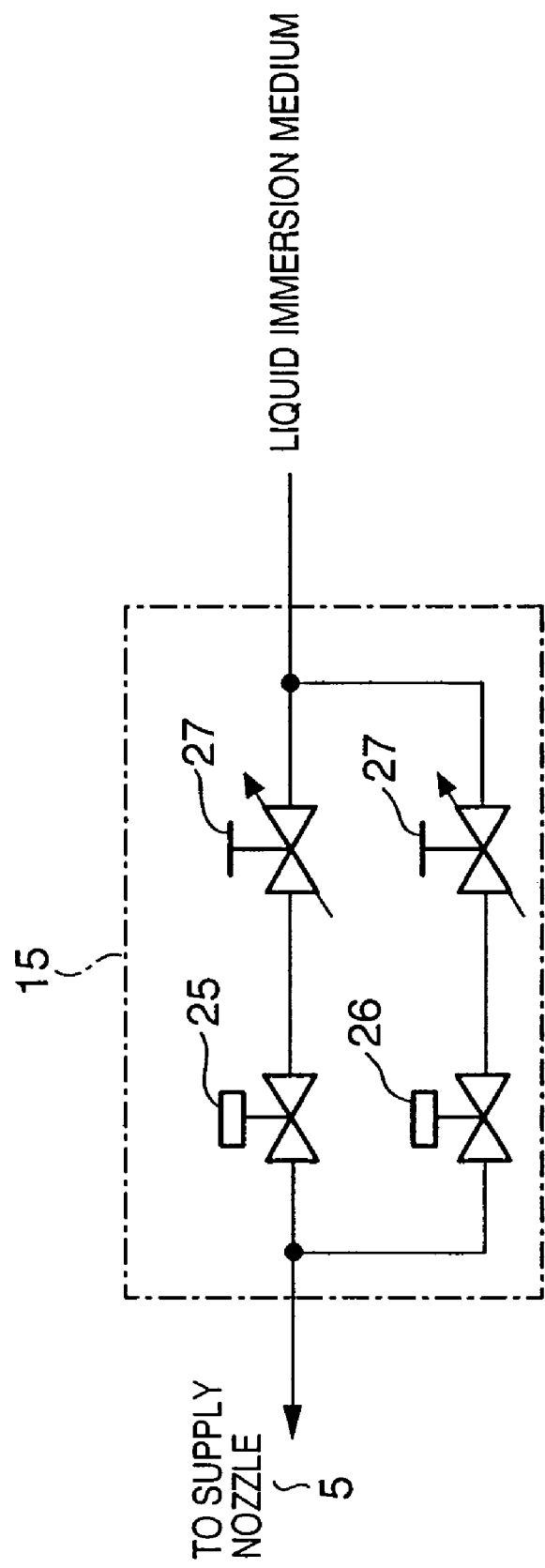
FIG. 5 is a view illustrating a liquid supply valve in a liquid immersion medium supply mechanism according to a Third Embodiment of the present invention.
Figure 6:
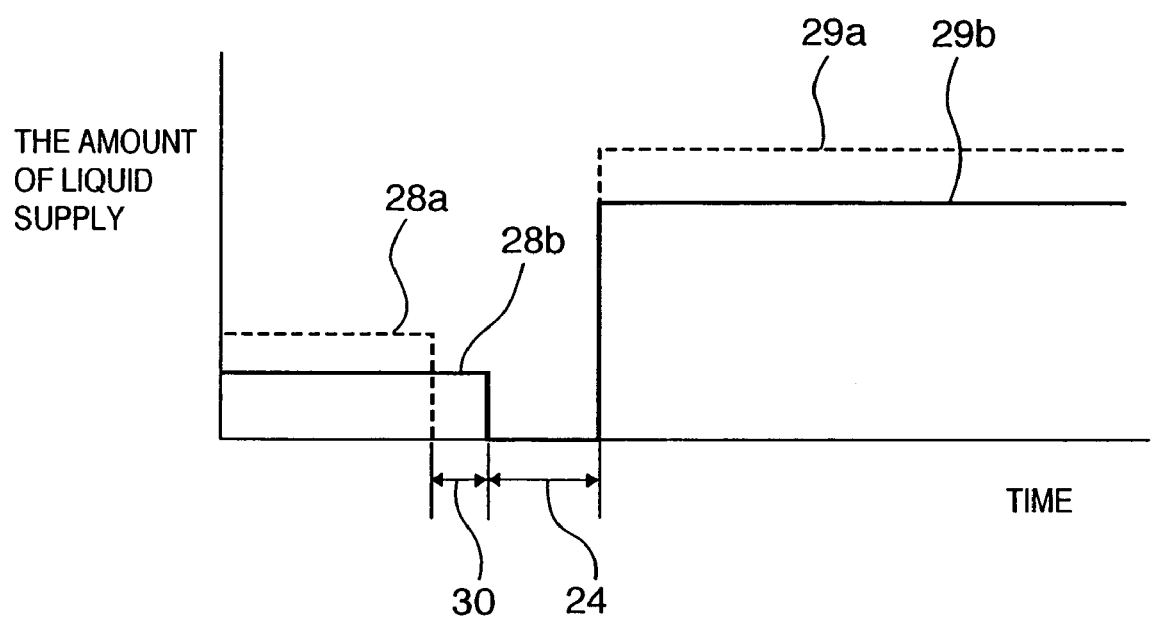
FIG. 6 is a diagram representing liquid-supply properties based on a liquid supply control according to the Third Embodiment.

FIG. 5 is a view illustrating a liquid supply valve of a liquid immersion medium supply mechanism according to a Third Embodiment of the present invention. FIG. 6 is a diagram representing liquid-supply properties based on liquid supply control according to the Third Embodiment.

In addition, the configuration of the Third Embodiment is the same as that of the First Embodiment, except for the liquid supply control to be explained below.

As illustrated in FIG. 5, the liquid supply line for the liquid immersion medium 6 is constituted in such a way as to be separated into a main pipeline controlled by a liquid supply main valve 25 and a sub pipeline controlled by a liquid supply sub-valve 26. The flow rate of each pipeline is preliminarily adjusted by a stationary needle valve 27.

In the case wherein after a stage drive sequence stops during the exposure processing and, in order to restart the processing, air in the pipeline is discharged as described above, the liquid supply sub-valve 26 is first opened to supply liquid only through the sub-pipeline having a low flow rate. Thereafter, when the air has been discharged and normal processing is restarted, the liquid supply main valve 25 is opened so that the processing is implemented at a normal flow rate. In this situation, switching from the sub-pipeline to the main pipeline may be performed or both pipelines may be concurrently used, as long as each flow rate is preliminarily set by means of the needle valve 27 to a predetermined rate. Liquid-supply properties as described above are represented by FIG. 6. The liquid supply control according to the Third Embodiment is inferior to that shown in FIG. 4 in terms of the control properties. However, it is made up with inexpensive ON/OFF-type electromagnetic valves.

Fourth Embodiment

Figure 7:
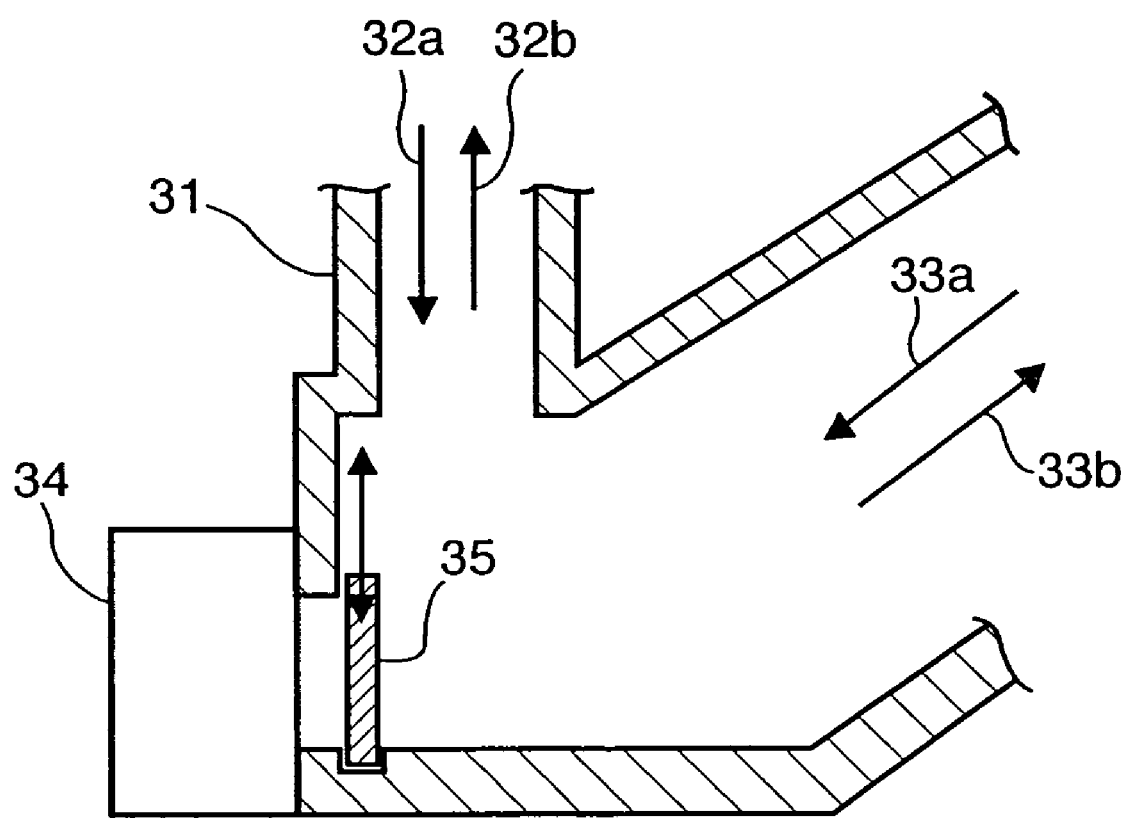
FIG. 7 is a view illustrating the structure of a supply nozzle of a liquid immersion medium supply mechanism according to a Fourth Embodiment of the present invention.

FIG. 7 is a view illustrating the structure of a supply nozzle in a Fourth Embodiment of the present invention.

The supply nozzle 5 illustrated in FIG. 7 has a sliding shutter mechanism (or a stop mechanism). By making a shutter 35 slide, the liquid supply outlet of the supply nozzle 5 is opened and closed, and thereby, the liquid supply is controlled. The moving direction of the shutter 35 may not only be the up-and-down direction as illustrated in FIG. 7, but also, may be anteroposterior direction (perpendicular direction) with respect to the plane of the paper. In addition, the drive mechanism has no particular limit. It is possible, therefore, to drive by means of an air cylinder or a pulse motor.

Moreover, the shutter may be fully opened or fully closed, as well as intermediately opened. Accordingly, it is possible to control the amount of liquid supply or liquid-supply pressure.

As also was briefly described in the explanation for the First Embodiment, during the normal exposure processing, the liquid immersion medium 6 should always be supplied. Therefore, the liquid immersion medium 6 flows in the direction indicated by reference numeral 33a toward the shutter. In this situation, if the air-bleeding valve 14 is closed and an air-bleeding pipeline 31 is filled up with the liquid immersion medium 6, opening the shutter 35 makes the liquid immersion medium 6 be supplied to the semiconductor wafer 9, by way of a porous ceramic 34.

When a drive sequence for wafer stage 10 is stopped for some causes, the liquid immersion medium 6 in the pipeline is recovered by, as described above, closing the liquid supply valve 15 and by fully opening the liquid recovery valve 16. In this situation, by opening the air-bleeding valve 14 connected to the air-bleeding pipeline 31 and supplying air in the direction indicated by reference numeral 32a, the liquid immersion medium 6 in the pipeline can be recovered into the liquid recovery tank 18. In FIG. 2, a vacuum source is connected to the liquid recovery tank 18. However, even though the vacuum source is not utilized, by connecting pressurized air to the air-bleeding pipeline 31 and opening the air-bleeding valve 14, it is possible to make the liquid flow in the direction indicated by reference numeral 32a. Thus, as is the case with the vacuum source being utilized, the liquid immersion medium 6 in the pipeline can be recovered into the liquid recovery tank 18. When pressurized air is supplied through the air-bleeding pipeline 31, the shutter 35 should be fully closed. However, in the case where, as in FIG. 2, the liquid immersion medium 6 is recovered by means of a vacuum source, the shutter 35 should not necessarily be closed at the same time. In the case where, as illustrated in FIG. 7, the porous ceramic 34 is connected, the shutter 35 would rather be kept open or be closed after some delay, in order to recover, by means of a negative pressure, the liquid immersion medium that has permeated into the porous ceramic 34.

In addition, in the case where the liquid supply is restarted after the liquid immersion medium 6 has been recovered, by closing the liquid recovery valve 16, by opening the air-bleeding valve 14, and by gradually supplying the liquid immersion medium 6 through the liquid supply valve 15, air accumulated in the pipeline can be released. In this situation, the direction of the flow of the air in the pipeline and the liquid immersion medium 6 is indicated by reference numeral 32b. By, after supplying a predetermined amount of the liquid immersion medium 6 and bleeding the air-bleeding pipeline of air, the air-bleeding valve 14 is closed. Thereby, the pipeline is filled up with the liquid immersion medium 6, so that the inside of the pipeline can be in a free-of-air state.

Fifth Embodiment

Figure 8:
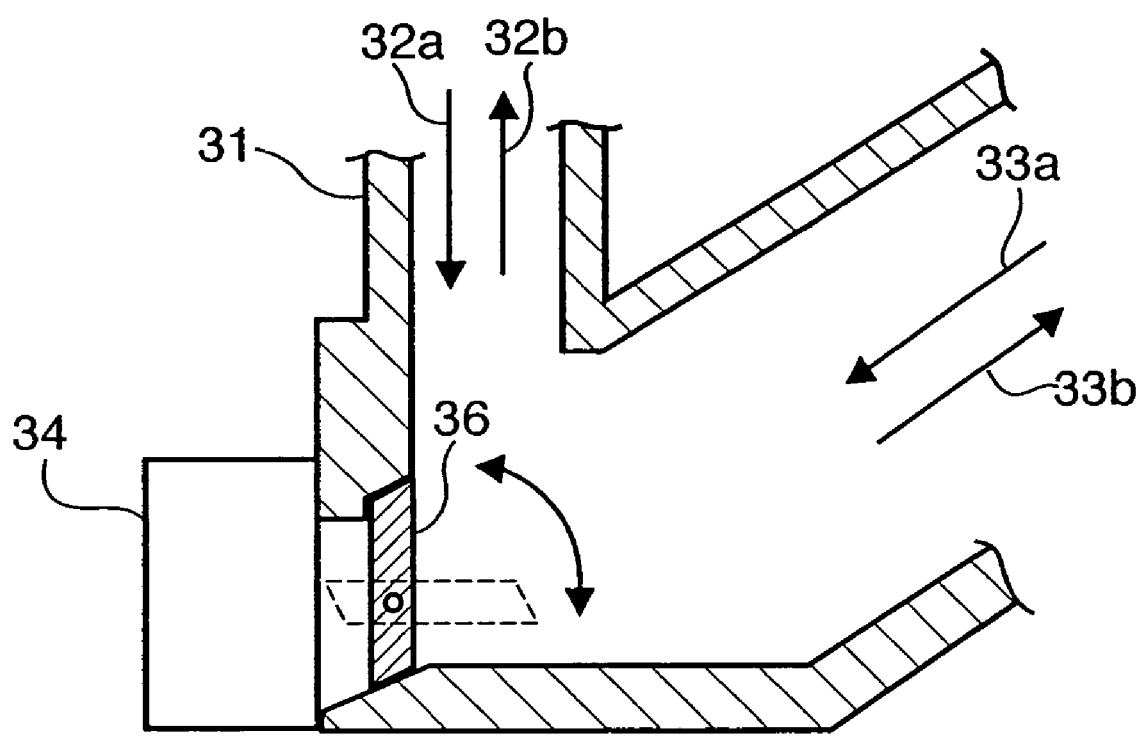
FIG. 8 is a view illustrating the structure of a supply nozzle of a liquid immersion medium supply mechanism according to a Fifth Embodiment of the present invention.

FIG. 8 is a view illustrating the structure of a supply nozzle in a Fifth Embodiment of the present invention.

The supply nozzle 5 illustrated in FIG. 8 has, instead of the sliding shutter mechanism in the Fourth Embodiment, a pivotal shutter mechanism. Other constituent elements are the same as those in the Fourth Embodiment described above.

By controlling the rotation angle of a pivotal shutter 36, illustrated in FIG. 8, that can pivot about an axle perpendicular to the plane of the paper, the liquid supply control for the liquid immersion medium 6 is implemented. In other words, the pivotal shutter 36 is driven so that the longitudinal axis of the pivotal shutter 36 becomes horizontal to fully open the supply nozzle 5, and that the longitudinal axis of the pivotal shutter 36 becomes vertical to fully close the supply nozzle 5. Appropriate setting of the pivotal center can suppress water leakage caused by water pressure.

As is the case with the sliding shutter 35, when the longitudinal axis of the pivotal shutter 36 is at an intermediate position, the flow rate can be made to correspond to a pivotal angle. In addition, the drive mechanism and the drive range are not limited in particular. Meanwhile, the supply and recovery methods for the liquid immersion medium 6 are the same as those in the Fourth Embodiment. Therefore, explanations for them will be omitted.

Sixth Embodiment

Figure 9:
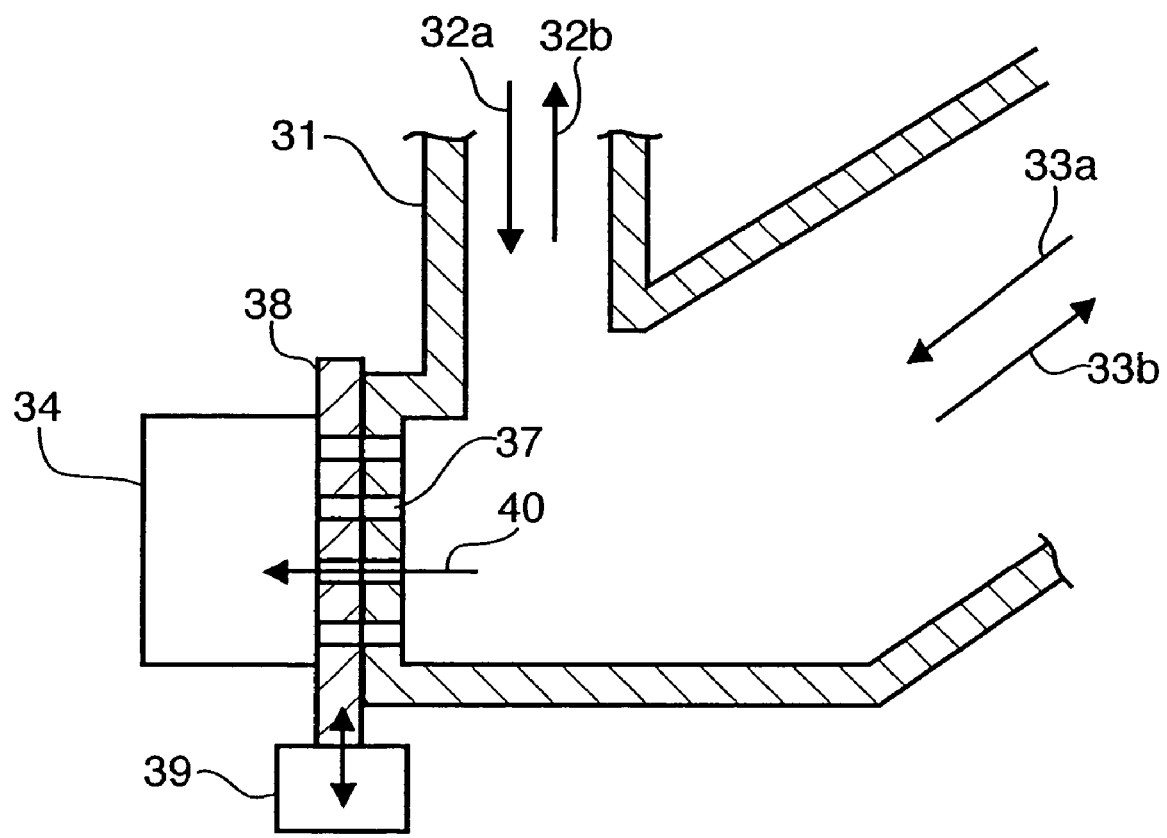
FIG. 9 is a view illustrating the structure of a supply nozzle of a liquid immersion medium supply mechanism according to a Sixth Embodiment of the present invention.

FIG. 9 is a view illustrating the structure of a supply nozzle in a Sixth Embodiment of the present invention.

The supply nozzle 5 illustrated in FIG. 9 has, instead of the above-described sliding shutter mechanism and pivotal shutter mechanism, a shutter mechanism made up of a great number of supply holes 37, a supply-hole opening and closing plate 38, and a piezo element 39. Other constituent elements are the same as those in Embodiments 4 and 5 described above.

In the shutter mechanism in the Sixth Embodiment, the supply hole 37 is formed not only in the up-and-down direction, but also in the normal direction with respect to the plane of the paper, and has a function for supplying the liquid immersion medium 6, which arrives thereat after flowing in the direction indicated by reference numeral 33a, in such a way that the liquid immersion medium 6 permeates into the porous ceramic 34. Accordingly, although only four supply holes are illustrated in FIG. 9, if more supply holes are provided, so much the better. The maximal supply amount and supply pressure can also be controlled.

The supply-hole opening and closing plate 38 is a movable plate for controlling opening and closing of the supply hole 37. By driving through the piezo element 39 the supply-hole opening and closing plate 38 up and down, the control of opening and closing of the supply hole 37 is enabled. The piezo element 39 is controlled by an unillustrated control mechanism. The supply amount also can be controlled through the adjustment of a driven amount or opening and closing durations (opening and closing period) of the supply-hole opening and closing plate 38.

In addition, FIG. 9 illustrates an example of supply control of the liquid immersion medium 6, enabled by means of a piezo element. For example, the number of and the arrangement of piezo elements may appropriately be modified or changed, and is not limited to those shown in the Sixth Embodiment. Similarly, the shapes or the number of the supply holes 37 and the drive direction for the supply-hole opening and closing plate 38 are not limited to those illustrated in FIG. 9.

Figure 10:
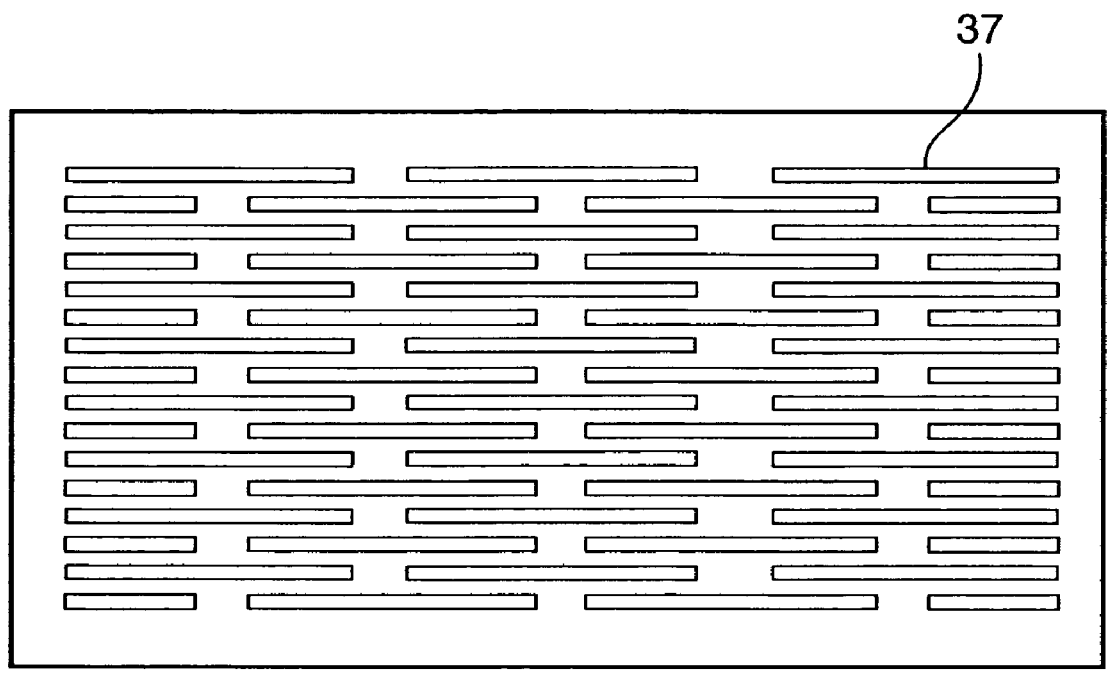
FIG. 10 is a view illustrating a drilling pattern for the supply holes illustrated in FIG. 9.

FIG. 10 illustrates a drilling pattern for the supply holes 37 illustrated in FIG. 9. A horizontally-elongated shape as illustrated in FIG. 10 enables the supply holes 37 to be open and closed and facilitates securing of the supply amount of the liquid immersion medium 6 even though the driving stroke, of the supply-hole opening and closing plate 38, by the piezo element 39 is small. Meanwhile, the supply and recovery methods for the liquid immersion medium 6 are the same as those shown in the Fourth Embodiment. Therefore, explanations for them will be omitted.

Seventh Embodiment

Figure 11:
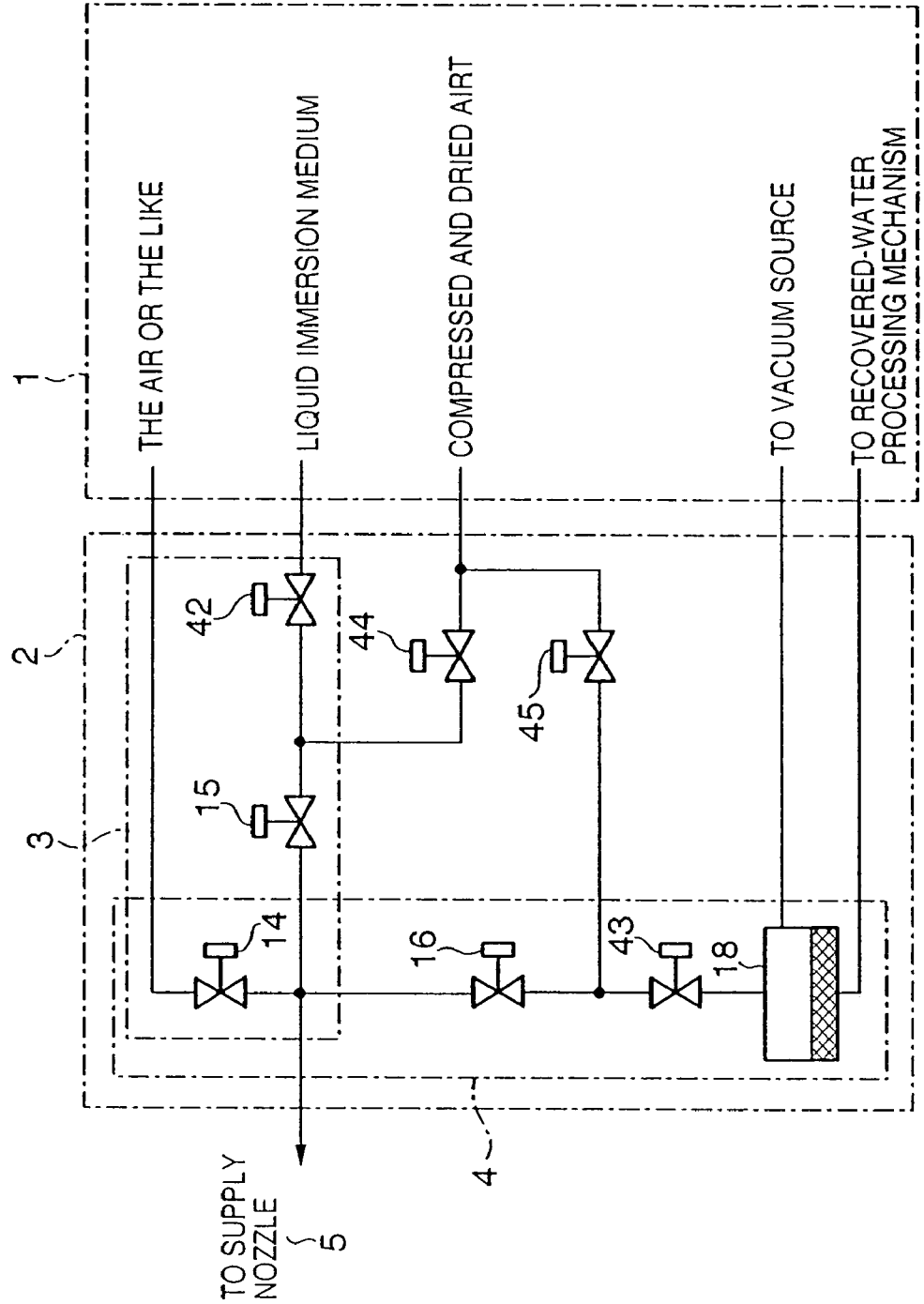
FIG. 11 is a flow diagram of a pipeline in a liquid immersion medium supply mechanism according to a Seventh Embodiment of the present invention.

FIG. 11 is a flow diagram of a pipeline in a liquid immersion medium supply mechanism according to a Seventh Embodiment of the present invention.

In the Seventh Embodiment, a function is added in which the liquid immersion medium 6 accumulated in the pipeline and the valves is blown up by discharging at once dry gas, or the like, and is dried. A liquid-supply-pipeline shield valve 42, a liquid recovering pipeline shield valve 43, and dry gas supply valves 44 and 45 are appropriately controlled, in addition to the control of opening and closing of the foregoing shutter mechanism of the supply nozzle 5 and the air-bleeding valve 14 Thereby, dry gas can be transported to a desired place.

For example, drying the front edge of the nozzle may be achieved by opening the nozzle shutter, keeping the air-bleeding valve 14 fully open, then fully closing the liquid-supply-pipeline shield valve 42 and the liquid-recovering-pipeline shield valve 43, fully opening the liquid supply valve 15 and the liquid recovery valve 16, and fully opening the dry gas supply valves 44 and 45. The supply pressure and the supply time for dry gas may be determined based on values preliminarily obtained through an experiment and values that can be accepted by the apparatus. In addition, in the case wherein the supply pressure for dry gas cannot be raised, controlling the opening extent of the shutter at the front edge of the nozzle, higher pressure can be applied to the front edge.

[Device Manufacturing Method]

Next, an embodiment of a device manufacturing method utilizing the foregoing exposure apparatus will be explained.

Figure 12:
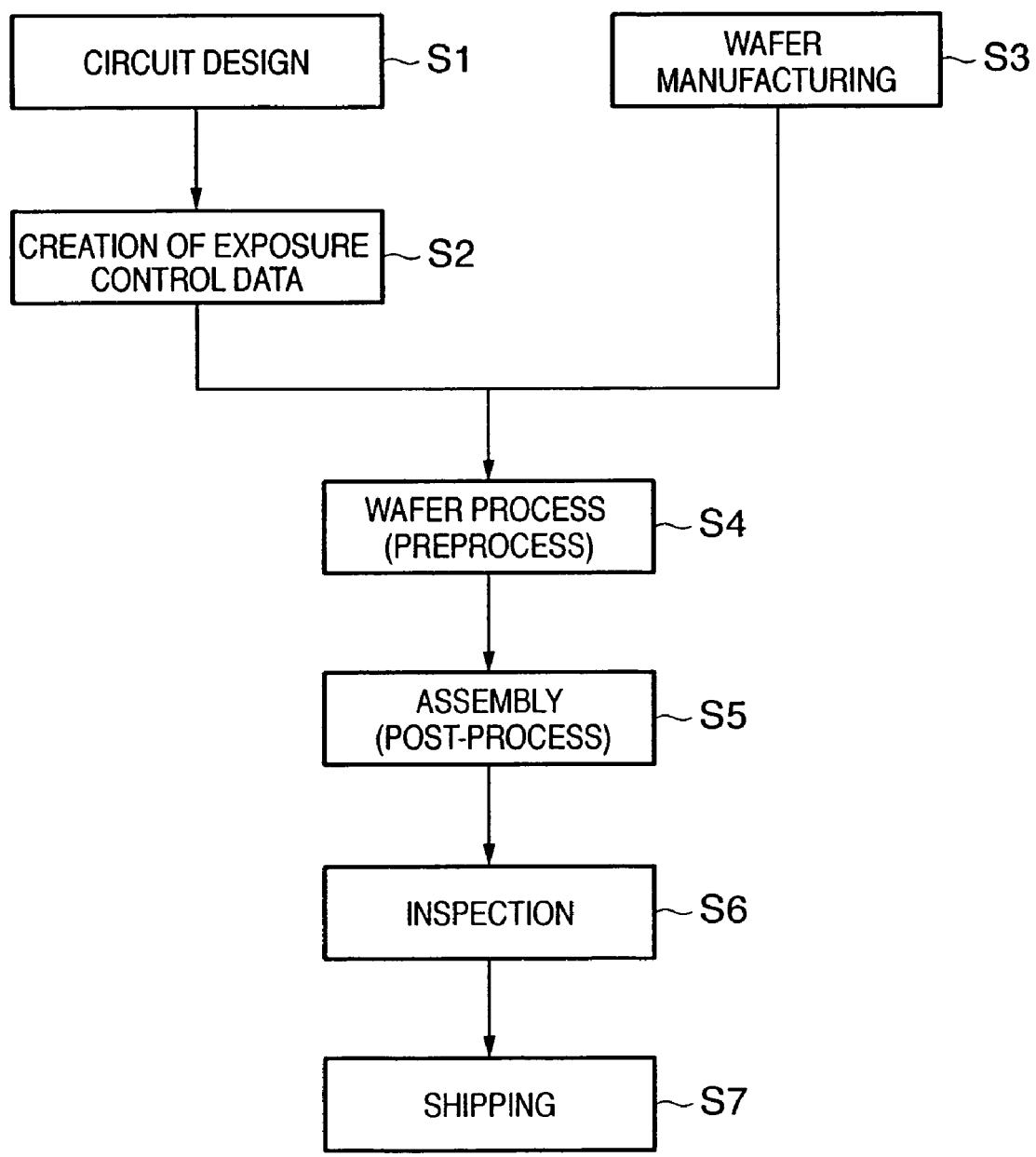
FIG. 12 is a view for explaining a manufacturing flow for a micro device.

FIG. 12 illustrates the flow of manufacturing of a micro device (e.g., a semiconductor chip, such as an IC and an LSI, a liquid crystal panel, a CCD, a thin-film magnetic head, a micro machine, and the like). In step S1 (circuit design), circuit design for a semiconductor device is implemented. In step S2 (data creation for exposure control), exposure-control data for an exposure apparatus is created based on a designed circuit pattern. Meanwhile, in step S3 (manufacturing of wafer), a wafer is manufactured by utilizing a material such as silicon, or the like. In step S4 (wafer process), which is referred to as a preprocess, by utilizing the exposure apparatus to which the prepared exposure-control data has been inputted and the wafer, an actual circuit is formed on the wafer, through lithography technology. Step S5 (assembly) following S4 is a process, referred to as a post-process, in which the wafer created in step S4 is made to be a semiconductor chip, and processes such as an assembly process (dicing and bonding), and a packaging process (chip sealing) are included. In step S6 (inspection), inspections, such as an operation check test and a durability test, on the semiconductor device created in step S5, are carried out. Through these processes, a semiconductor device is completed, and then is shipped (step S7).

Figure 13:
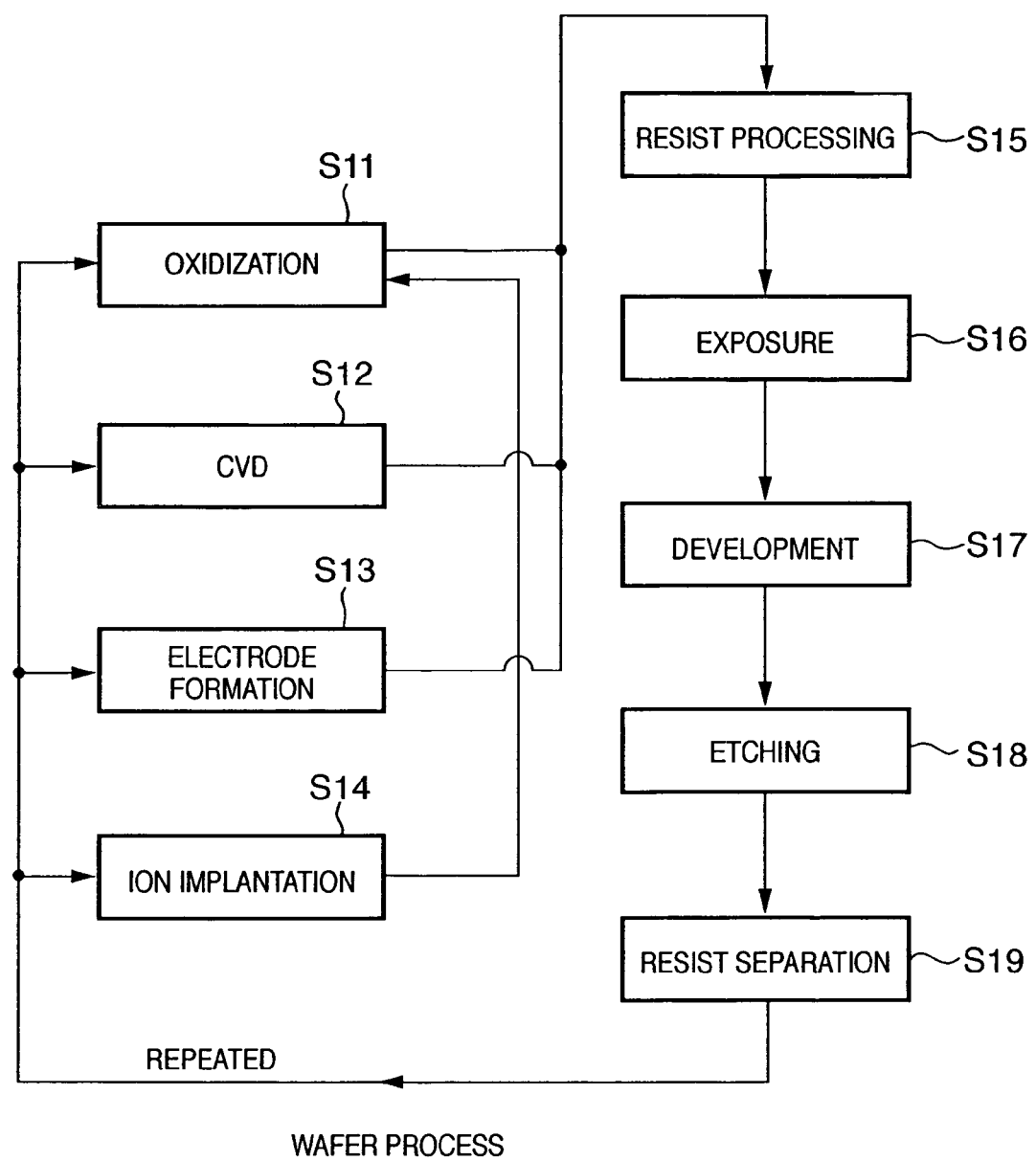
FIG. 13 is a view for explaining a wafer process.

FIG. 13 illustrates the detailed flow of the foregoing wafer process. In step S11 (oxidization), the surface of a wafer is oxidized. In step S12 (CVD), an insulating film is formed on the surface of the wafer. In step S13 (electrode formation), an electrode is formed through deposition on the wafer. In step S14 (ion implantation), ions are implanted into the wafer. In step S15 (resist processing), a photosensitizing agent is painted on the wafer. In step S16 (exposure), a circuit pattern is baked and exposed on the wafer, by means of the foregoing exposure apparatus. In step S17 (development), the exposed wafer is developed. In step 18 (etching), portions other than the developed resist image are etched off. In step S19 (resist separation), the out-of-use resist after the etching is removed. By repeatedly implementing these steps, a multilayered circuit pattern is formed on the wafer.

The present invention is not limited to the above embodiments and various changes and modifications can be made within the spirit and scope of the present invention. Therefore, to apprise the public of the scope of the present invention, the following claims are made.

CLAIM OF PRIORITY

This application claims priority from Japanese Patent Application No. 2004-257418 filed on Sep. 3, 2004, which is hereby incorporated by reference herein.

What is claimed is:

1. An exposure apparatus which exposes a pattern of an original onto a substrate through a projection optical system with a space between said projection optical system and the substrate filled with liquid, said apparatus comprising:
    a liquid supply nozzle configured to supply the liquid to the space through a liquid supply opening, wherein a porous ceramic is provided with the liquid supply opening of the liquid supply nozzle;
    a liquid supply unit configured to supply the liquid into the liquid supply nozzle;
    a liquid recovery unit configured to recover the liquid in the liquid supply nozzle by using a vacuum source; and
    a gas supply unit configured to supply a gas into the liquid supply nozzle through a pipe connected to the liquid supply opening of the liquid supply nozzle,
    wherein a gas supply by the gas supply unit is started and a liquid recovery by the liquid recovery unit is started while a liquid supply by the liquid supply unit is stopped.

2. The apparatus according to claim 1, wherein the liquid supply by the liquid supply unit is stopped while a stage for holding and moving the substrate being stopped or an exposure operation is stopped.

3. The apparatus according to claim 1, further comprising a dry gas supply unit configured to supply a dried gas into the liquid supply nozzle.

4. The apparatus according to claim 1, further comprising a liquid recovery nozzle configured to recover the liquid supplied to the space by the liquid supply nozzle.

5. The apparatus according to claim 1, wherein the gas supply unit supplies the gas into the liquid supply nozzle so that the gas flows in the liquid supply nozzle in a direction opposite to a flow direction of the liquid supplied into the liquid supply nozzle by the liquid supply unit.

6. An exposure apparatus which exposes a pattern of an original onto a substrate through a projection optical system with a space between said projection optical system and the substrate filled with liquid, said apparatus comprising:
    a liquid supply nozzle configured to supply the liquid to the space through a liquid supply opening, wherein a porous ceramic is provided with the liquid supply opening of the liquid supply nozzle;
    a liquid supply unit configured to supply the liquid into the liquid supply nozzle;
    a liquid recovery unit configured to recover the liquid in the liquid supply nozzle by using a vacuum source;
    a gas supply unit configured to supply a compressed gas into the liquid supply nozzle through a pipe connected to the liquid supply opening of the liquid supply nozzle; and
    a shutter configured to cut off a liquid supply path to the space at the liquid supply opening,
    wherein a gas supply by the gas supply unit is started and a liquid recovery by the liquid recovery unit is started after cutting off the liquid supply path to the space by the shutter while a liquid supply by the liquid supply unit is stopped.

7. The apparatus according to claim 6, wherein the gas supply unit supplies the gas into the liquid supply nozzle so that the gas flows in the liquid supply nozzle in a direction opposite to a flow direction of the liquid supplied into the liquid supply nozzle by the liquid supply unit.

8. An exposure apparatus which exposes a pattern of an original onto a substrate through a projection optical system with a space between said projection optical system and the substrate filled with liquid, said apparatus comprising:
    a liquid supply nozzle configured to supply the liquid to the space through a liquid supply opening, wherein a porous ceramic is provided with the liquid supply opening of the liquid supply nozzle;
    a liquid supply unit configured to supply the liquid into the liquid supply nozzle;
    a liquid recovery unit configured to recover the liquid in the liquid supply nozzle; and
    a gas supply unit configured to supply a gas into the liquid supply nozzle,
    wherein a gas supply by the gas supply unit is started and a liquid recovery by the liquid recovery unit is started while a liquid supply by the liquid supply unit is stopped.

9. The apparatus according to claim 8, wherein the gas supply unit supplies the gas into the liquid supply nozzle so that the gas flows in the liquid supply nozzle in a direction opposite to a flow direction of the liquid supplied into the liquid supply nozzle by the liquid supply unit.

10. An exposure apparatus which exposes a pattern of an original onto a substrate through a projection optical system with a space between said projection optical system and the substrate filled with liquid, said apparatus comprising:
    a liquid supply nozzle configured to supply the liquid to the space through a liquid supply opening;
    a liquid supply unit configured to supply the liquid into the liquid supply nozzle;
    a liquid recovery unit configured to recover the liquid in the liquid supply nozzle by using a vacuum source; and
    a gas supply unit configured to supply a gas into the liquid supply nozzle through a pipe connected to the liquid supply opening of the liquid supply nozzle,
    wherein a gas supply by the gas supply unit is started and a liquid recovery by the liquid recovery unit is started while a liquid supply by the liquid supply unit is stopped, and
    wherein the gas supply unit supplies the gas into the liquid supply nozzle so that the gas flows in the liquid supply nozzle in a direction opposite to a flow direction of the liquid supplied into the liquid supply nozzle by the liquid supply unit.

11. An exposure apparatus which exposes a pattern of an original onto a substrate through a projection optical system with a space between said projection optical system and the substrate filled with liquid, said apparatus comprising:
    a liquid supply nozzle configured to supply the liquid to the space through a liquid supply opening;
    a liquid supply unit configured to supply the liquid into the liquid supply nozzle;
    a liquid recovery unit configured to recover the liquid in the liquid supply nozzle by using a vacuum source;
    a gas supply unit configured to supply a compressed gas into the liquid supply nozzle through a pipe connected to the liquid supply opening of the liquid supply nozzle; and
    a shutter configured to cut off a liquid supply path to the space at the liquid supply opening,
    wherein a gas supply by the gas supply unit is started and a liquid recovery by the liquid recovery unit is started after cutting off the liquid supply path to the space by the shutter while a liquid supply by the liquid supply unit is stopped, and wherein the gas supply unit supplies the gas into the liquid supply nozzle so that the gas flows in the liquid supply nozzle in a direction opposite to a flow direction of the liquid supplied into the liquid supply nozzle by the liquid supply unit.

12. An exposure apparatus which exposes a pattern of an original onto a substrate through a projection optical system with a space between said projection optical system and the substrate filled with liquid, said apparatus comprising:

a liquid supply nozzle configured to supply the liquid to the space;

a liquid supply unit configured to supply the liquid into the liquid supply nozzle;

a liquid recovery unit configured to recover the liquid in the liquid supply nozzle; and a gas supply unit configured to supply a gas into the liquid supply nozzle, wherein a gas supply by the gas supply unit is started and a liquid recovery by the liquid recovery unit is started while a liquid supply by the liquid supply unit is stopped, and wherein the gas supply unit supplies the gas into the liquid supply nozzle so that the gas flows in the liquid supply nozzle in a direction opposite to a flow direction of the liquid supplied into the liquid supply nozzle by the liquid supply unit.

* * * * *

UNITED STATES PATENT AND TRADEMARK OFFICE
CERTIFICATE OF CORRECTION

PATENT NO. : 7,365,828 B2  
APPLICATION NO. : 11/215021  
DATED : April 29, 2008  
INVENTOR(S) : Yuichi Takamura Page 1 of 1

It is certified that error appears in the above-identified patent and that said Letters Patent is hereby corrected as shown below:

COLUMN 1:
Line 23, "No. 10-303114)," should read -- No. 10-303114). --.

COLUMN 2:
Line 18, "liquid-immersion-medium," should read -- liquid immersion medium, --.

COLUMN 4:
Line 54, "liquid-immersion" should read -- liquid immersion --.

COLUMN 6:
Line 59, "suppress more" should read -- further suppress --.

COLUMN 8:
Line 26, "rather" should read -- preferably --.

COLUMN 9:
Line 66, "liquid-supply-pipeline" should read -- liquid supply pipeline --.

COLUMN 10:
Line 4, "valve 14 Thereby" should read -- valve 14. Thereby --.
Line 8, "liquid-" should read -- liquid --.
Line 9, "supply-pipeline" should read -- supply pipeline -- and "liquid-recovering" should read -- liquid recovering --.
Line 57, "step 18" should read -- step S18 --.

Signed and Sealed this

Thirtieth Day of September, 2008

JON W. DUDAS  
*Director of the United States Patent and Trademark Office*